United States Patent
Sung

(10) Patent No.: US 12,549,174 B2
(45) Date of Patent: Feb. 10, 2026

(54) SWITCH CIRCUIT

(71) Applicant: REALTEK SEMICONDUCTOR CORPORATION, Hsinchu (TW)

(72) Inventor: Ya-Hsuan Sung, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 191 days.

(21) Appl. No.: 18/536,319

(22) Filed: Dec. 12, 2023

(65) Prior Publication Data

US 2024/0235541 A1 Jul. 11, 2024

(30) Foreign Application Priority Data

Jan. 5, 2023 (TW) ................................. 112100444

(51) Int. Cl.
*H03K 17/082* (2006.01)
*H03K 17/06* (2006.01)

(52) U.S. Cl.
CPC ....... *H03K 17/0822* (2013.01); *H03K 17/063* (2013.01)

(58) Field of Classification Search
CPC ............. H03K 17/0822; H03K 17/063; H03K 2217/0054; H03K 17/687
USPC .......... 27/427; 327/581, 419, 425, 530, 534, 327/379, 387, 374, 375, 376, 377, 434, 327/436, 574, 403, 404
See application file for complete search history.

(56) References Cited

U.S. PATENT DOCUMENTS

| | | | | |
|---|---|---|---|---|
| 3,749,936 A * | 7/1973 | Bell | ................. | H03K 19/00315 326/14 |
| 4,810,911 A * | 3/1989 | Noguchi | ............... | H03K 17/693 327/431 |
| 4,937,469 A * | 6/1990 | Larson | .................... | G05F 3/262 330/288 |
| 5,111,076 A * | 5/1992 | Tarng | ............... | H03K 19/00361 326/27 |
| 5,639,680 A * | 6/1997 | Hoeld | ................. | H03K 17/161 438/210 |
| 6,154,085 A * | 11/2000 | Ramakrishnan | ..... | H03K 17/063 327/427 |
| 6,285,537 B2 * | 9/2001 | Allen | ...................... | A61P 15/10 326/83 |
| 6,392,392 B1 * | 5/2002 | Nakahara | ........... | H03K 17/0822 324/762.02 |

* cited by examiner

*Primary Examiner* — Thienvu V Tran
*Assistant Examiner* — Muaamar Qahtan Al-Taweel
(74) *Attorney, Agent, or Firm* — WPAT, PC

(57) ABSTRACT

A switch circuit that has input and output terminals and a control terminal includes first to fourth transistors, a resistor, and a pull-low circuit. The first transistor has first and terminals. The second transistor has third and fourth terminals. The third transistor has fifth and sixth terminals. The fourth transistor has seventh and eighth terminals. The first to fourth transistors have first to fourth control terminals, respectively. The resistor has ninth and tenth terminals. The control terminal is coupled to the first and fourth control terminals. The first and third terminals are coupled to the input terminal. The second and sixth terminals are coupled to the output terminal. The fourth terminal is coupled to the fifth and ninth terminals. The seventh terminal is coupled to the tenth terminal and the second and third control terminals. The eighth terminal is coupled to a reference voltage.

20 Claims, 6 Drawing Sheets

SWITCH CIRCUIT

BACKGROUND OF THE INVENTION

1. Field of the Invention

The present invention generally relates to switch circuits.

2. Description of Related Art

FIG. 1 is a functional block diagram of a conventional switch circuit according to an embodiment. The switch circuit 100 includes a transistor MN, a transistor MP, and an inverter 110. The transistor MN is an N-channel Metal-Oxide-Semiconductor Field-Effect Transistor (hereinafter referred to as an NMOS transistor), and the transistor MP is a P-channel Metal-Oxide-Semiconductor Field-Effect Transistor (hereinafter referred to as a PMOS transistor).

When the control signal Ctrl is at a high level, both the transistor MN and the transistor MP are turned on (i.e., the switch circuit 100 is switched on); as a result, the output voltage Vout is equal to the input voltage Vin. When the control signal Ctrl is at a low level, the switch circuit 100 is switched off. However, when the level of the control signal Ctrl is uncertain (e.g., when the switch circuit 100 is not connected to the power), the gate voltage of the transistor MP is likely to be 0 volts (i.e., the transistor MP is turned on), resulting in an unwanted leakage current between the input terminal Nin and the output terminal Nout of the switch circuit 100.

SUMMARY OF THE INVENTION

In view of the issues of the prior art, an object of the present invention is to provide switch circuits, so as to make an improvement to the prior art.

According to one aspect of the present invention, a switch circuit is provided. The switch circuit has an input terminal, an output terminal, and a control terminal and includes a first transistor, a second transistor, a third transistor, a fourth transistor, a first resistor, and a pull-low circuit. The first transistor has a first terminal, a second terminal, and a first control terminal. The second transistor has a third terminal, a fourth terminal, and a second control terminal. The third transistor has a fifth terminal, a sixth terminal, and a third control terminal. The fourth transistor has a seventh terminal, an eighth terminal, and a fourth control terminal. The first resistor has a ninth terminal and a tenth terminal. The pull-low circuit is coupled to the first control terminal. The control terminal is coupled to the first control terminal, the fourth control terminal, and the pull-low circuit. The first terminal and the third terminal are coupled to the input terminal. The second terminal and the sixth terminal are coupled to the output terminal. The fourth terminal is coupled to the fifth terminal and the ninth terminal. The seventh terminal is coupled to the tenth terminal, the second control terminal, and the third control terminal. The eighth terminal is coupled to a first reference voltage.

The technical means embodied in the embodiments of the present invention can solve at least one of the problems of the prior art. Therefore, compared to the prior art, the present invention can reduce or avoid leakage currents.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes switch circuits. On account of that some or all elements of the switch circuits could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

In the following discussion, each transistor has a first terminal, a second terminal, and a control terminal. When the transistor is used as a switch, the first terminal and the second terminal of the transistor are two terminals of the switch, and the control terminal controls the switch to be switched on (the transistor is turned on) or off (the transistor is turned off). For a Metal-Oxide-Semiconductor Field-Effect Transistor (MOSFET), the first terminal may be one of the source and the drain, the second terminal is the other of the source and the drain, and the control terminal is the gate.

Figure 1:
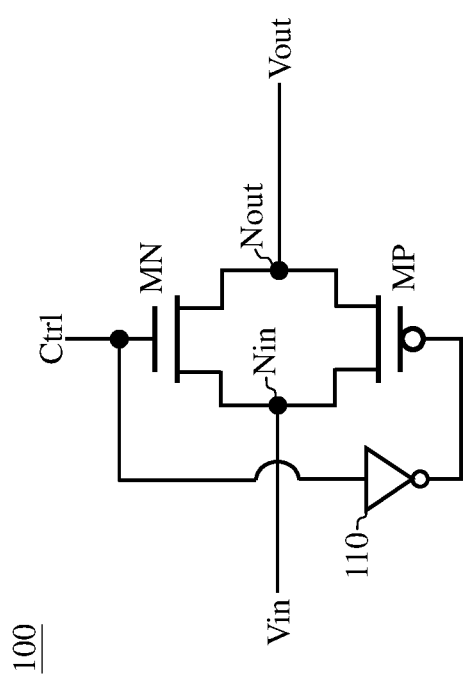
FIG. 1 is a functional block diagram of a conventional switch circuit according to an embodiment.
Figure 2:
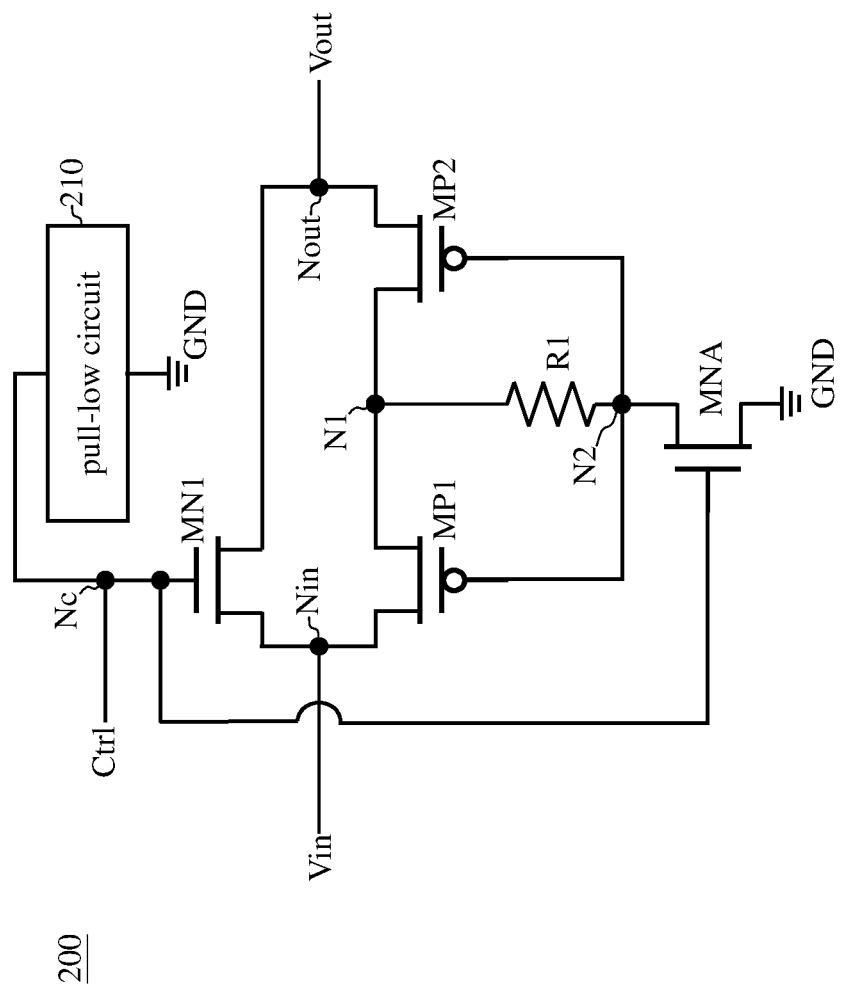
FIG. 2 is a functional block diagram of a switch circuit according to an embodiment of the present invention.

FIG. 2 is a functional block diagram of the switch circuit according to an embodiment of the present invention. The switch circuit 200 includes an NMOS transistor MN1, a PMOS transistor MP1, a PMOS transistor MP2, an NMOS transistor MNA, a resistor R1, and a pull-low (e.g., weakly pull-low (WPL)) circuit 210.

The gate of the NMOS transistor MN1 is coupled or electrically connected to the pull-low circuit 210 and the control terminal Nc of the switch circuit 200. One of the source and the drain of the NMOS transistor MN1 is coupled or electrically connected to the input terminal Nin, and the other is coupled or electrically connected to the output terminal Nout.

The gate of the PMOS transistor MP1 is coupled or electrically connected to the node N2. One of the source and the drain of the PMOS transistor MP1 is coupled or electrically connected to the input terminal Nin, and the other is coupled or electrically connected to the node N1.

The gate of the PMOS transistor MP2 is coupled or electrically connected to the node N2. One of the source and the drain of the PMOS transistor MP2 is coupled or electrically connected to the output terminal Nout, and the other is coupled or electrically connected to the node N1.

The gate of the NMOS transistor MNA is coupled or electrically connected to the gate of the NMOS transistor MN1, the control terminal Nc, and the pull-low circuit 210. One of the source and the drain of the NMOS transistor MNA is coupled or electrically connected to the node N2, and the other is coupled or electrically connected to a reference voltage GND (e.g., ground).

One terminal of the resistor R1 is coupled or electrically connected to the node N1; the other terminal of the resistor R1 is coupled or electrically connected to the node N2.

The pull-low circuit 210 is coupled between the control terminal Nc and the reference voltage GND. In some embodiments, the pull-low circuit 210 may be embodied by a resistor (e.g., a resistor with a relatively large resistance value).

When the control signal Ctrl is at a high level (e.g., the power supply voltage VDD, VDD>GND), the NMOS transistor MN1 and the NMOS transistor MNA are turned on, causing the node N2 to be at a low level (e.g., the reference voltage GND), which in turn causes the PMOS transistor MP1 and the PMOS transistor MP2 to be turned on. In other words, when the control signal Ctrl is at the high level, the NMOS transistor MN1, the PMOS transistor MP1, and the PMOS transistor MP2 are all turned on (i.e., the switch circuit 200 is switched on), so that the input terminal Nin, the node N1, and the output terminal Nout are substantially equipotential (i.e., a signal connection is formed between the input terminal Nin and the output terminal Nout, that is, the input voltage Vin is substantially identical to the output voltage Vout).

When the control signal Ctrl is at the low level, the NMOS transistor MN1 and the NMOS transistor MNA are turned off. At this point, if the PMOS transistor MP1 is turned on due to an uncertain gate voltage, the voltage at the node N1 is substantially identical to the input voltage Vin. Furthermore, since the NMOS transistor MNA is turned off and no current flows into the gate of the PMOS transistor MP1 and the gate of the PMOS transistor MP2, the voltage across the resistor R1 is substantially 0 volts (i.e., the voltage at the node N1 is substantially equal to the voltage at the node N2). In other words, when the control signal Ctrl is at the low level, the PMOS transistor MP2 is turned off (because its gate-source voltage (Vgs) is substantially 0 volts), and the NMOS transistor MN1 is turned off. As a result, the switch circuit 200 is switched off, so that no signal connection is formed between the input terminal Nin and the output terminal Nout (i.e., there is no leakage current between the input terminal Nin and the output terminal Nout).

Figure 3:
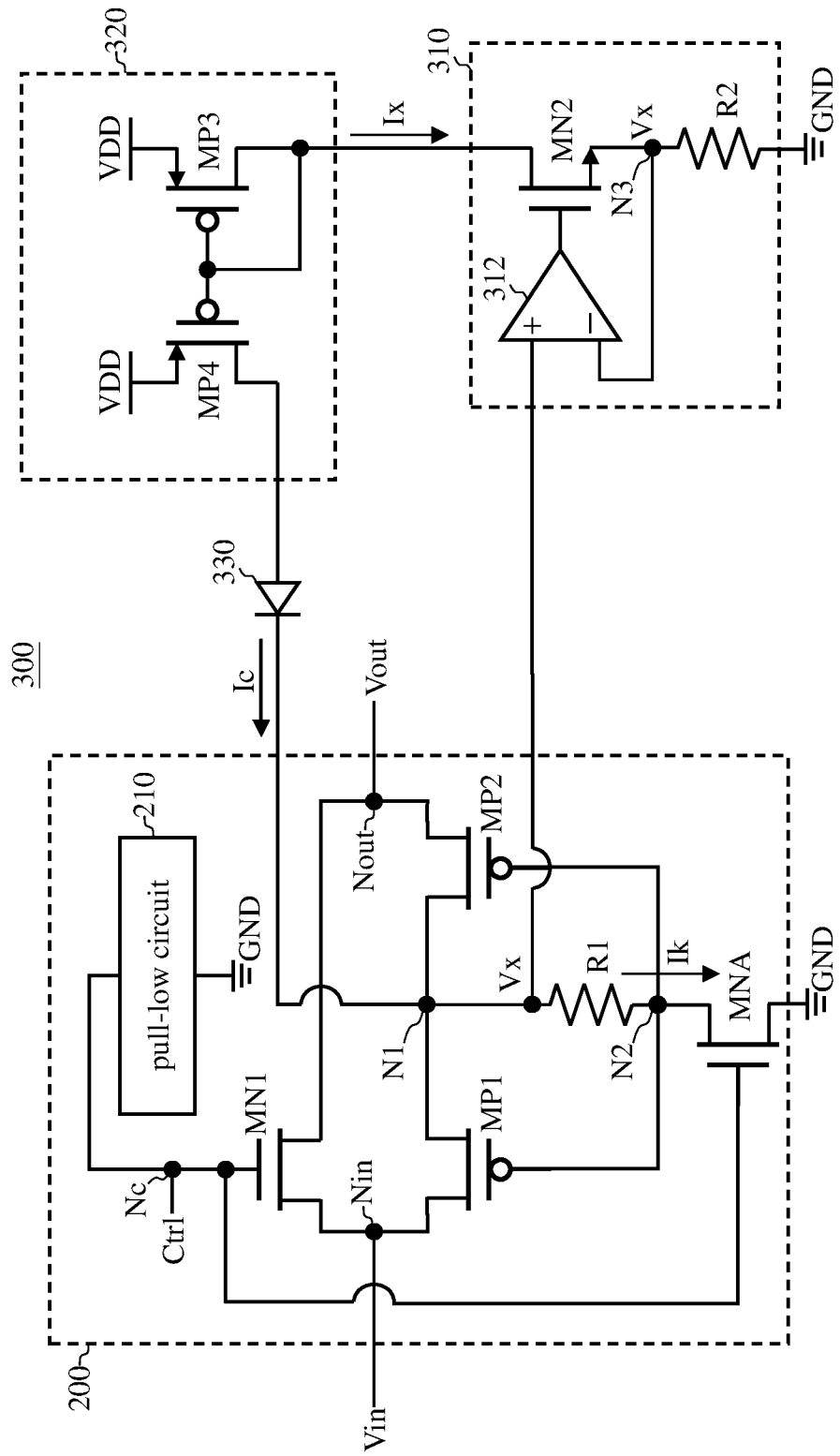
FIG. 3 is a functional block diagram of a switch circuit according to another embodiment of the present invention.

FIG. 3 is a functional block diagram of a switch circuit according to another embodiment of the present invention. The switch circuit 300 includes a switch circuit 200, a voltage detection circuit 310, a current compensation circuit 320, and a diode 330. The voltage detection circuit 310 is coupled or electrically connected to the node N1 of the switch circuit 200 and configured to generate a current Ix according to the voltage Vx at the node N1. The current compensation circuit 320 is coupled or electrically connected to the voltage detection circuit 310 and is coupled or electrically connected to the node N1 of the switch circuit 200. The current compensation circuit 320 is configured to generate a compensation current Ic according to the current Ix.

The voltage detection circuit 310 includes an operational amplifier 312, an NMOS transistor MN2, and a resistor R2. The non-inverting input terminal of the operational amplifier 312 is coupled or electrically connected to the node N1. The inverting input terminal of the operational amplifier 312 is coupled or electrically connected to a node N3. The output terminal of the operational amplifier 312 is coupled or electrically connected to the gate of the NMOS transistor MN2. The source of the NMOS transistor MN2 is coupled or electrically connected to the node N3. The drain of the NMOS transistor MN2 is coupled or electrically connected to the current compensation circuit 320. One terminal of the resistor R2 is coupled or electrically connected to the node N3; the other terminal of the resistor R2 is coupled or electrically connected to the reference voltage GND.

Since the inverting input terminal and the non-inverting input terminal of the operational amplifier 312 are effectively virtual ground, the voltage at the node N3 is substantially the voltage Vx. Therefore, the current Ix=Vx/R2.

The current compensation circuit 320 is coupled or electrically connected to a reference voltage (e.g., the power supply voltage VDD) and includes a PMOS transistor MP3 and a PMOS transistor MP4. The PMOS transistor MP3 and the PMOS transistor MP4 form a current mirror. Ix:Ic=A3:A4, where A3 and A4 are the size (i.e., aspect ratio) of the PMOS transistor MP3 and the size of the PMOS transistor MP4, respectively. The operating principle of the current mirror is well known to people having ordinary skill in the art, so the details are omitted herein for brevity. The compensation current Ic is used to compensate for the leakage current Ik that flows, when the switch circuit 200 is switched on, from the node N1 to the reference voltage GND (path: the node N1→the resistor R1→the node N2→the NMOS transistor MNA→the reference voltage GND).

The compensation current Ic can be changed by adjusting the resistance value of the resistor R1, the resistance value of the resistor R2, the size A3, and the size A4. In some embodiments, R1=R2 and A3=A4 such that Ik=Ix=Ic.

When the switch circuit 300 is not connected to the power and the diode 330 does not exist, the PMOS transistor MP4 is likely to form a potential leakage current path (e.g., from the node N1 to the power supply voltage VDD through the PMOS transistor MP4). However, the diode 330 can block this leakage current. The anode of the diode 330 is coupled or electrically connected to the current compensation circuit 320. The cathode of the diode 330 is coupled or electrically connected to the switch circuit 200 (more specifically, to the node N1).

In some embodiments, if the leakage current flowing through the PMOS transistor MP4 is relatively small (which may result, for example, from a better manufacturing process and/or design of the PMOS transistor MP4), the diode 330 may be omitted.

Figure 4:
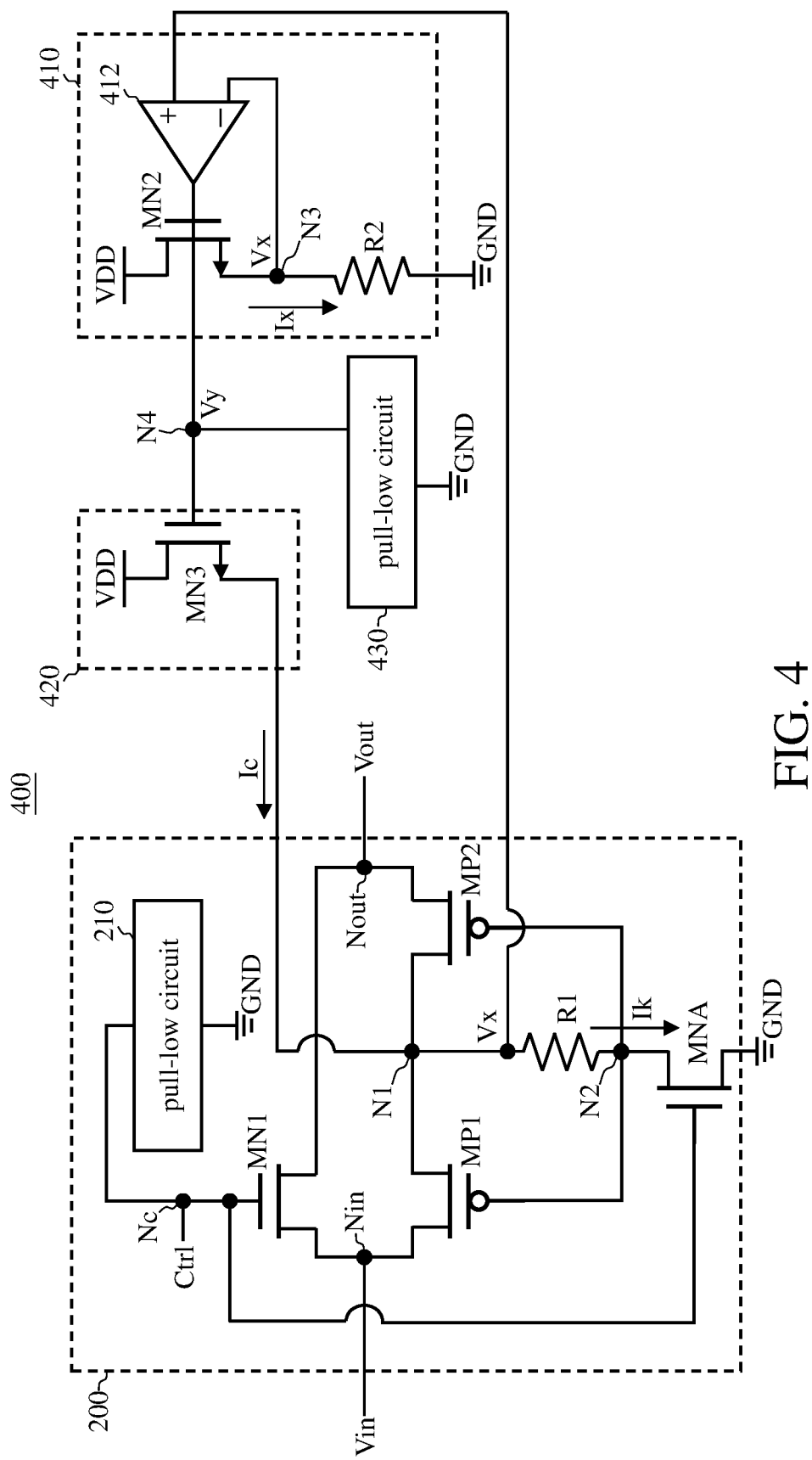
FIG. 4 is a functional block diagram of a switch circuit according to another embodiment of the present invention.

FIG. 4 is a functional block diagram of a switch circuit according to another embodiment of the present invention. The switch circuit 400 includes a switch circuit 200, a voltage detection circuit 410, a current compensation circuit 420, and a pull-low circuit 430. The voltage detection circuit 410 is coupled or electrically connected to the node N1 of the switch circuit 200 and configured to generate a voltage Vy according to the voltage Vx at the node N1. The current compensation circuit 420 is coupled or electrically connected to the voltage detection circuit 410 and is coupled or electrically connected to the node N1 of the switch circuit 200. The current compensation circuit 420 is configured to generate the compensation current Ic according to the voltage Vy.

The voltage detection circuit 410 includes an operational amplifier 412, an NMOS transistor MN2, and a resistor R2. The voltage detection circuit 410 is similar to the voltage detection circuit 310, except that the drain of the NMOS transistor MN2 of the voltage detection circuit 410 is coupled or electrically connected to the power supply voltage VDD. The output terminal of the operational amplifier 412 is coupled or electrically connected to the gate of the NMOS transistor MN2 and the node N4. The operational amplifier 412 outputs the voltage Vy.

The current compensation circuit 420 includes an NMOS transistor MN3. The gate of the NMOS transistor MN3 is coupled or electrically connected to the node N4. The source of the NMOS transistor MN3 is coupled or electrically connected to the switch circuit 200 (more specifically, to the node N1). The drain of the NMOS transistor MN3 is coupled or electrically connected to the power supply voltage VDD. Because the NMOS transistor MN2 and the NMOS transistor MN3 have the same gate-source voltage (i.e., Vgs=Vy−Vx), Ix:Ic=A2:A3 (where A2 and A3 are the size of the NMOS transistor MN2 and the size of the NMOS transistor MN3, respectively).

In some embodiments, when A2=A3 and R1=R2, Ic=Ix=Ik.

The pull-low circuit 430 is coupled or electrically connected to the node N4. When the switch circuit 400 is not connected to the power, the voltage Vy at the node N4 is pulled low to the reference voltage GND by the pull-low circuit 430. As a result, the NMOS transistor MN3 is turned off, preventing a leakage current from the node N1 to the power supply voltage VDD through the NMOS transistor MN3.

Figure 5:
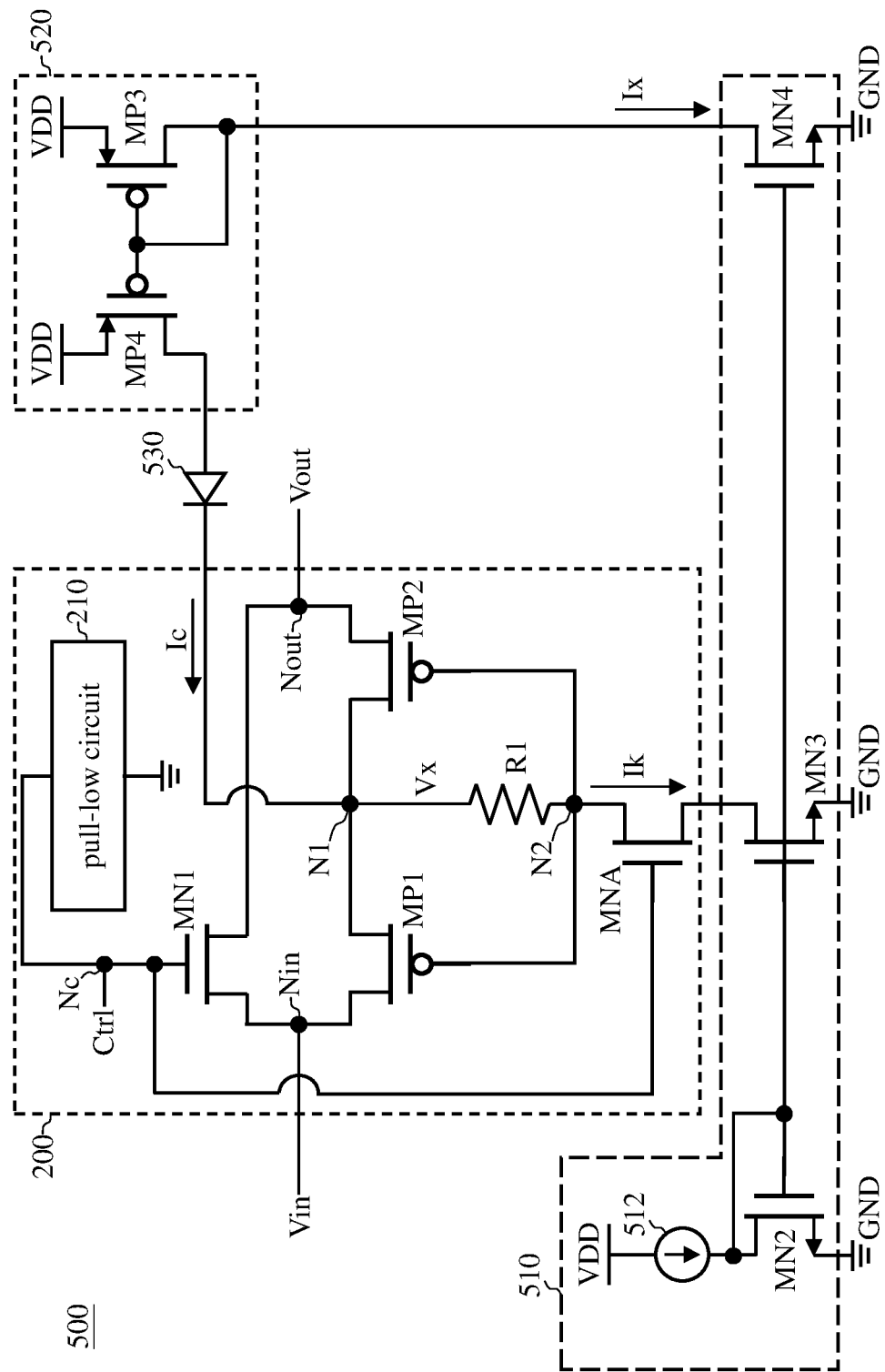
FIG. 5 is a functional block diagram of a switch circuit according to another embodiment of the present invention.

FIG. 5 is a functional block diagram of a switch circuit according to another embodiment of the present invention. The switch circuit 500 includes a switch circuit 200, a current detection circuit 510, a current compensation circuit 520, and a diode 530. The current detection circuit 510 is coupled or electrically connected to the NMOS transistor MNA of the switch circuit 200 and configured to generate the current Ix according to the leakage current Ik. The current compensation circuit 520 is coupled or electrically connected to the current detection circuit 510 and is coupled or electrically connected to the node N1 of the switch circuit 200. The current compensation circuit 520 is configured to generate the compensation current Ic according to the current Ix.

The current detection circuit 510 includes a current source 512, an NMOS transistor MN2, an NMOS transistor MN3, and an NMOS transistor MN4. One terminal of the current source 512 is coupled or electrically connected to the power supply voltage VDD; the other terminal of the current source 512 is coupled or electrically connected to the drain of the NMOS transistor MN2. The gate of the NMOS transistor MN2 is coupled or electrically connected to the drain of the NMOS transistor MN2. The source of the NMOS transistor MN2 is coupled or electrically connected to the reference voltage GND. The gate of the NMOS transistor MN3 is coupled or electrically connected to the gate of the NMOS transistor MN2 and the drain of the NMOS transistor MN2. The drain of the NMOS transistor MN3 is coupled or electrically connected to the NMOS transistor MNA. The source of the NMOS transistor MN3 is coupled or electrically connected to the reference voltage GND. The gate of the NMOS transistor MN4 is coupled or electrically connected to the gate of the NMOS transistor MN2 and the gate of the NMOS transistor MN3. The drain of the NMOS transistor MN4 is coupled or electrically connected to the current compensation circuit 520. The source of the NMOS transistor MN4 is coupled or electrically connected to the reference voltage GND.

Because the NMOS transistor MN2, the NMOS transistor MN3, and the NMOS transistor MN4 form a current mirror, Ik:Ix=A3:A4 (A3 and A4 are the size of the NMOS transistor MN3 and the size of the NMOS transistor MN4, respectively).

The current compensation circuit 520 and the diode 530 are similar to the current compensation circuit 320 and the diode 330, respectively, so the details are omitted herein for brevity. Similarly, the diode 530 may be omitted.

In some embodiments, by adjusting the sizes of the NMOS transistor MN3, the NMOS transistor MN4, the PMOS transistor MP3, and the PMOS transistor MP4, Ic=Ix=Ik can be achieved.

Figure 6:
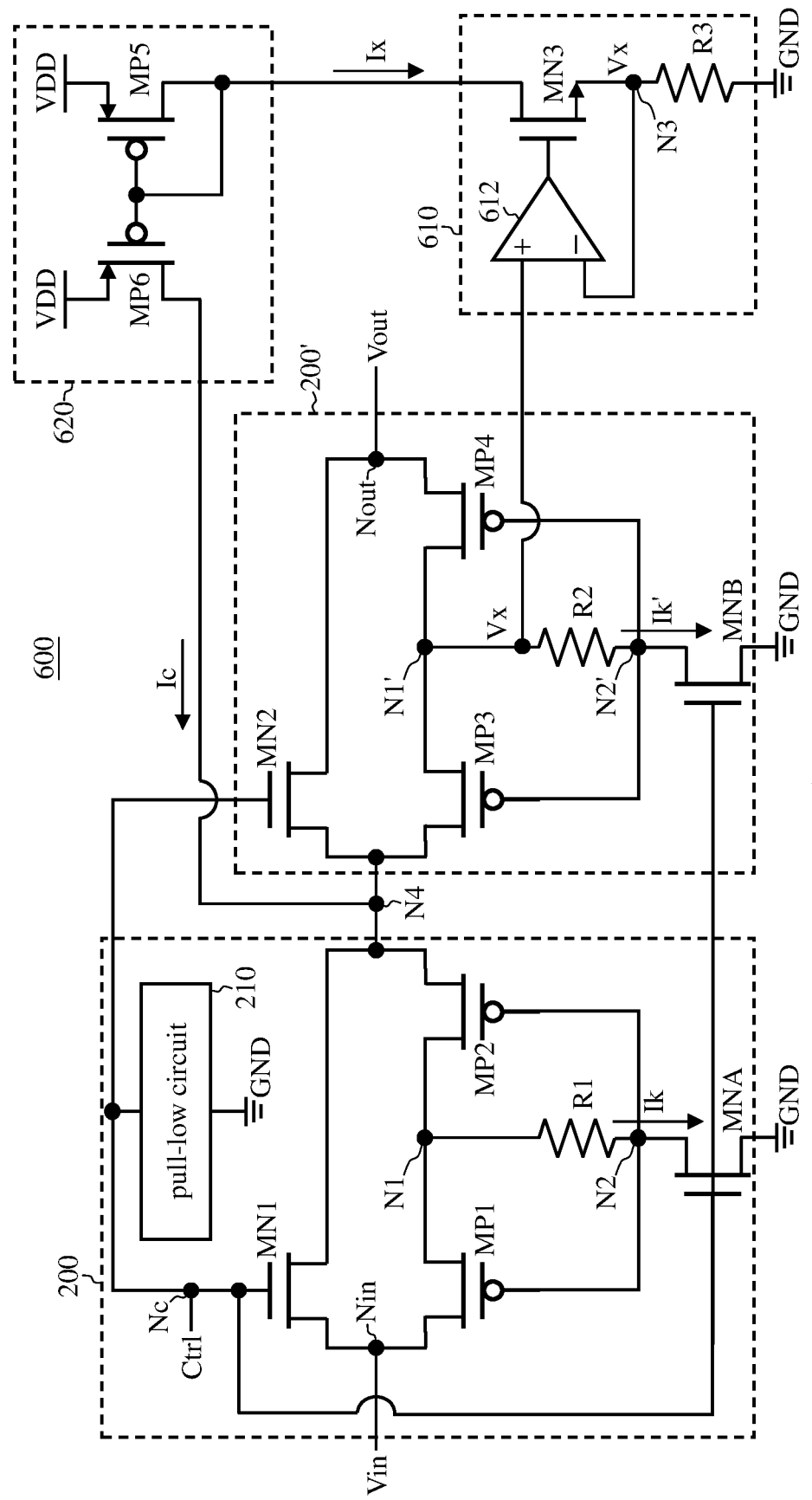
FIG. 6 is a functional block diagram of a switch circuit according to another embodiment of the present invention.

FIG. 6 is a functional block diagram of a switch circuit according to another embodiment of the present invention. The switch circuit 600 includes a switch circuit 200, a switch circuit 200', a voltage detection circuit 610, and a current compensation circuit 620. The switch circuit 200' and the switch circuit 200 are substantially identical and share the pull-low circuit 210. The output terminal (i.e., the node N4) of the switch circuit 200 is coupled or electrically connected to the input terminal (i.e., the node N4) of the switch circuit 200'. The output terminal of the switch circuit 200' (i.e., the output terminal Nout) is the output terminal of the switch circuit 600. The voltage detection circuit 610 is configured to generate a current Ix according to the voltage Vx at the node N1'. The current compensation circuit 620 is coupled or electrically connected to the voltage detection circuit 610 and is coupled or electrically connected to the switch circuit 200 and the switch circuit 200'. The current compensation circuit 620 is configured to generate a compensation current Ic according to the current Ix.

The switch circuit 200' includes an NMOS transistor MN2, a PMOS transistor MP3, a PMOS transistor MP4, an NMOS transistor MNB, and a resistor R2.

The gate of the NMOS transistor MN2 is coupled or electrically connected to the pull-low circuit 210, the gate of the NMOS transistor MN1, and the control terminal Nc (i.e., the gate of the NMOS transistor MN2 receives the control signal Ctrl). One of the source and the drain of the NMOS transistor MN2 is coupled or electrically connected to the node N4, and the other is coupled or electrically connected to the output terminal Nout.

The gate of the PMOS transistor MP3 is coupled or electrically connected to the node N2'. One of the source and the drain of the PMOS transistor MP3 is coupled or electrically connected to the node N4, and the other is coupled or electrically connected to the node N1'.

The gate of the PMOS transistor MP4 is coupled or electrically connected to the node N2'. One of the source and the drain of the PMOS transistor MP4 is coupled or electrically connected to the output terminal Nout, and the other is coupled or electrically connected to the node N1'.

The gate of the NMOS transistor MNB is coupled or electrically connected to the gate of the NMOS transistor MN1, the gate of the NMOS transistor MN2, and the control terminal Nc (i.e., the gate of the NMOS transistor MNB receives the control signal Ctrl). One of the source and the drain of the NMOS transistor MNB is coupled or electrically connected to the node N2', and the other is coupled or electrically connected to the reference voltage GND.

One terminal of the resistor R2 is coupled or electrically connected to the node N1'; the other terminal of the resistor R2 is coupled or electrically connected to the node N2'. In some embodiments, the resistance value of the resistor R2 is equal to the resistance value of the resistor R1.

When the switch circuit 600 is turned on (i.e., when both the switch circuit 200 and the switch circuit 200' are switched on), the voltage at the node N1 is substantially equal to the voltage Vx at the node N1'. Therefore, when R1=R2, the magnitude of the leakage current Ik is substantially equal to the magnitude of the leakage current Ik'.

The voltage detection circuit 610 includes an operational amplifier 612, an NMOS transistor MN3, and a resistor R3. The current compensation circuit 620 includes a PMOS transistor MP5 and a PMOS transistor MP6. The PMOS transistor MP5 and the PMOS transistor MP6 form a current mirror. The voltage detection circuit 610 and the current compensation circuit 620 are identical or similar to the voltage detection circuit 310 and the current compensation circuit 320, respectively, so the details are omitted herein for brevity.

In some embodiments, the resistor R1, the resistor R2, and the resistor R3 have the same resistance value (thus, Ix=Ik'=Ik), and the size of the PMOS transistor MP6 is twice the size of the PMOS transistor MP5 (thus, Ic=2*Ix). As a result, the compensation current Ic can compensate for both the leakage current Ik and the leakage current Ik'.

In cases where the switch circuit 600 is not connected to the power, there is no leakage current between the input terminal Nin and the PMOS transistor MP6, and there is no leakage current between the output terminal Nout and the PMOS transistor MP6 because the NMOS transistor MN1, the NMOS transistor MN2, the PMOS transistor MP2, and the PMOS transistor MP3 are all turned off (refer to the discussion with respect to FIG. 2).

Since the voltages at the node N1, the node N4, and the node N1' are substantially identical when the switch circuit 600 is switched on, in an alternative embodiment, the operational amplifier 612 of the voltage detection circuit 610 may be coupled or electrically connected to the node N1 or the node N4.

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A switch circuit having an input terminal, an output terminal, and a control terminal, comprising:
a first transistor having a first terminal, a second terminal, and a first control terminal;
a second transistor having a third terminal, a fourth terminal, and a second control terminal;
a third transistor having a fifth terminal, a sixth terminal, and a third control terminal;
a fourth transistor having a seventh terminal, an eighth terminal, and a fourth control terminal;
a first resistor having a ninth terminal and a tenth terminal; and
a pull-low circuit coupled to the first control terminal and electrically connected to ground;
wherein the control terminal is coupled to the first control terminal, the fourth control terminal, and the pull-low circuit, the first terminal and the third terminal are coupled to the input terminal, the second terminal and the sixth terminal are coupled to the output terminal, the fourth terminal is coupled to the fifth terminal and the ninth terminal, the seventh terminal is coupled to the tenth terminal, the second control terminal, and the third control terminal, and the eighth terminal is coupled to a first reference voltage.

2. The switch circuit of claim 1, wherein the control terminal receives a control signal;
when the control signal is at a target level, the first transistor, the second transistor, the third transistor, and the fourth transistor are turned on, so that the input terminal and the output terminal form a signal connection; when the control signal is not at the target level, the first transistor, the second transistor, the third transistor, and the fourth transistor are turned off, so that no signal connection is formed between the input terminal and the output terminal.

3. The switch circuit of claim 2 further comprising:
a voltage detection circuit coupled to the ninth terminal and configured to detect a voltage at the ninth terminal and generate a current according to the voltage;
a current compensation circuit coupled to the voltage detection circuit and the ninth terminal and configured to generate a compensation current according to the current;
wherein the compensation current is provided to the ninth terminal.

4. The switch circuit of claim 3, wherein the voltage detection circuit comprises:
a second resistor having an eleventh terminal and a twelfth terminal, wherein the twelfth terminal is coupled to the first reference voltage;
a fifth transistor having a thirteenth terminal, a fourteenth terminal, and a fifth control terminal, wherein the fourteenth terminal is coupled to the eleventh terminal; and
an operational amplifier having a first input terminal, a second input terminal, and a first output terminal, wherein the first input terminal is coupled to the ninth terminal, the second input terminal is coupled to the eleventh terminal and the fourteenth terminal, and the first output terminal is coupled to the fifth control terminal.

5. The switch circuit of claim 4, wherein the current compensation circuit is a current mirror and is coupled to the thirteenth terminal.

6. The switch circuit of claim 3 further comprising:
a diode having an anode and a cathode, wherein the anode is coupled to the current compensation circuit, and the cathode is coupled to the ninth terminal.

7. The switch circuit of claim 2 further comprising:
a voltage detection circuit coupled to the ninth terminal and configured to detect a voltage at the ninth terminal and generate an intermediate voltage according to the voltage; and
a current compensation circuit coupled to the voltage detection circuit and the ninth terminal and configured to generate a compensation current according to the intermediate voltage;
wherein the compensation current is provided to the ninth terminal.

8. The switch circuit of claim 7, wherein the voltage detection circuit comprises:
a second resistor having an eleventh terminal and a twelfth terminal, wherein the twelfth terminal is coupled to the first reference voltage;

a fifth transistor having a thirteenth terminal, a fourteenth terminal, and a fifth control terminal, wherein the fourteenth terminal is coupled to the eleventh terminal, and the thirteenth terminal is coupled to a second reference voltage; and an operational amplifier having a first input terminal, a second input terminal, and a first output terminal, wherein the first input terminal is coupled to the ninth terminal, the second input terminal is coupled to the eleventh terminal and the fourteenth terminal, and the first output terminal is coupled to the fifth control terminal and outputs the intermediate voltage.

9. The switch circuit of claim 8, wherein the current compensation circuit is a sixth transistor having a fifteenth terminal, a sixteenth terminal, and a sixth control terminal, the fifteenth terminal is coupled to the second reference voltage, the sixteenth terminal is coupled to the ninth terminal, and the sixth control terminal is coupled to the first output terminal.

10. The switch circuit of claim 9, wherein the pull-low circuit is a first pull-low circuit, the switch circuit further comprising:
a second pull-low circuit coupled to the sixth control terminal.

11. The switch circuit of claim 2 further comprising:
a current detection circuit coupled to the eighth terminal and configured to detect a first current flowing through the fourth transistor to generate a second current; and
a current compensation circuit coupled to the current detection circuit and the ninth terminal and configured to generate a compensation current according to the second current;
wherein the compensation current is provided to the ninth terminal.

12. The switch circuit of claim 11, wherein the current detection circuit comprises:
a current source;
a fifth transistor coupled between the current source and the first reference voltage and having a fifth control terminal;
a sixth transistor coupled between the fourth transistor and the first reference voltage and having a sixth control terminal; and
a seventh transistor coupled to the current compensation circuit and the first reference voltage and having a seventh control terminal;
wherein the fifth control terminal, the sixth control terminal, and the seventh control terminal are coupled to each other.

13. The switch circuit of claim 12, wherein the current compensation circuit is a current mirror coupled to the seventh transistor and configured to generate the compensation current according to the second current.

14. The switch circuit of claim 11 further comprising:
a diode having an anode and a cathode, wherein the anode is coupled to the current compensation circuit, and the cathode is coupled to the ninth terminal.

15. The switch circuit of claim 2 further comprising:
a fifth transistor having an eleventh terminal, a twelfth terminal, and a fifth control terminal;
a sixth transistor having a thirteenth terminal, a fourteenth terminal, and a sixth control terminal;
a seventh transistor having a fifteenth terminal, a sixteenth terminal, and a seventh control terminal;
an eighth transistor having a seventeenth terminal, an eighteenth terminal, and an eighth control terminal;

a second resistor having a nineteenth terminal and a twentieth terminal;
a voltage detection circuit configured to generate a current; and
a current compensation circuit coupled to the voltage detection circuit and configured to generate a compensation current according to the current;
wherein the eleventh terminal and the thirteenth terminal are electrically connected to a node, the twelfth terminal and the sixteenth terminal are coupled to the output terminal, the fourteenth terminal is coupled to the fifteenth terminal and the nineteenth terminal, the seventeenth terminal is coupled to the twentieth terminal, the sixth control terminal, and the seventh control terminal, the eighteenth terminal is coupled to the first reference voltage, the voltage detection circuit is coupled to one of the ninth terminal, the nineteenth terminal, and the node, and the compensation current is provided to the node.

16. The switch circuit of claim 15, wherein the voltage detection circuit comprises:
a third resistor having a twenty-first terminal and a twenty-second terminal, wherein the twenty-second terminal is coupled to the first reference voltage;
a ninth transistor having a twenty-third terminal, a twenty-fourth terminal, and a ninth control terminal, wherein the twenty-fourth terminal is coupled to the twenty-first terminal; and
an operational amplifier having a first input terminal, a second input terminal, and a first output terminal, wherein the first input terminal is coupled to one of the ninth terminal, the nineteenth terminal, and the node, the second input terminal is coupled to the twenty-first terminal and the twenty-fourth terminal, and the first output terminal is coupled to the ninth control terminal.

17. The switch circuit of claim 16, wherein the current compensation circuit is a current mirror and is coupled to the twenty-third terminal.

18. The switch circuit of claim 1, wherein the first transistor and the fourth transistor are N-channel metal-oxide-semiconductor field-effect transistors, and the second transistor and the third transistor are P-channel metal-oxide-semiconductor field-effect transistors.

19. A switch circuit having an input terminal, an output terminal, and a control terminal, comprising:
a first transistor having a first terminal, a second terminal, and a first control terminal;
a second transistor having a third terminal, a fourth terminal, and a second control terminal;
a third transistor having a fifth terminal, a sixth terminal, and a third control terminal;
a fourth transistor having a seventh terminal, an eighth terminal, and a fourth control terminal;
a first resistor having a ninth terminal and a tenth terminal; and
a pull-low circuit coupled to the first control terminal;
wherein the control terminal is coupled to the first control terminal, the fourth control terminal, and the pull-low circuit, the first terminal and the third terminal are coupled to the input terminal, the second terminal and the sixth terminal are coupled to the output terminal, the fourth terminal is coupled to the fifth terminal and the ninth terminal, the seventh terminal is coupled to the tenth terminal, the second control terminal, and the third control terminal, and the eighth terminal is coupled to a first reference voltage;

wherein the first transistor and the fourth transistor are N-channel metal-oxide-semiconductor field-effect transistors, and the second transistor and the third transistor are P-channel metal-oxide-semiconductor field-effect transistors.

20. A switch circuit having an input terminal, an output terminal, and a control terminal, comprising:
- a first transistor having a first terminal, a second terminal, and a first control terminal;
- a second transistor having a third terminal, a fourth terminal, and a second control terminal;
- a third transistor having a fifth terminal, a sixth terminal, and a third control terminal;
- a fourth transistor having a seventh terminal, an eighth terminal, and a fourth control terminal;
- a first resistor having a ninth terminal and a tenth terminal; and
- a pull-low circuit coupled to the first control terminal;
- wherein the control terminal is coupled to the first control terminal, the fourth control terminal, and the pull-low circuit, the first terminal and the third terminal are coupled to the input terminal, the second terminal and the sixth terminal are coupled to the output terminal, the fourth terminal is coupled to the fifth terminal and the ninth terminal, the seventh terminal is coupled to the tenth terminal, the second control terminal, and the third control terminal, and the eighth terminal is coupled to a first reference voltage;
- wherein the first to fourth transistors comprise two N-channel metal-oxide-semiconductor field-effect transistors and two P-channel metal-oxide-semiconductor field-effect transistors.

\* \* \* \* \*